United States Patent [19]
Koh

[11] Patent Number: 5,286,608
[45] Date of Patent: Feb. 15, 1994

[54] $TIO_x$ AS AN ANTI-REFLECTION COATING FOR METAL LITHOGRAPHY

[75] Inventor: Chao-Ming Koh, Hsin, Taiwan

[73] Assignee: Industrial Technology Research Institute, Hsinchu, Taiwan

[21] Appl. No.: 884,772

[22] Filed: May 18, 1992

[51] Int. Cl.$^5$ .............................. G03F 7/26; G03C 5/00
[52] U.S. Cl. ..................................... 430/313; 430/311; 430/314; 430/317; 430/318; 430/329; 430/950; 156/643; 156/659.1
[58] Field of Search ................ 430/311, 313, 314, 317, 430/318, 329, 950; 156/643, 659.1, 661

[56] References Cited

U.S. PATENT DOCUMENTS

| | | | |
|---|---|---|---|
| 4,495,220 | 1/1985 | Wolf | 430/313 |
| 4,767,660 | 8/1988 | Hosoda | 430/318 |
| 4,820,611 | 4/1989 | Arnold | 430/311 |

*Primary Examiner*—Marion E. McCamish
*Assistant Examiner*—Kathleen Duda
*Attorney, Agent, or Firm*—George O. Saile

[57] ABSTRACT

A new method of producing an anti-reflection coating is described. The reflective metal layer of an integrated circuit is covered with titanium. The titanium layer is oxidized. The resulting titanium oxide layer is the anti-reflection coating (ARC) of the present invention. This ARC layer is covered with photoresist. The photoresist layer is selectively exposed to light by directing light through a patterned mask to form a pattern on the photoresist layer. The metal layer is etched in accordance with the pattern. The remaining resist is stripped off. An inter-metal dielectric layer is deposited over the patterned first metal and titanium oxide layers. A second photoresist layer is deposited and selectively exposed to light through a second photomask. The titanium oxide layer again acts to limit the reflection of light off the first metal layer and through the transparent inter-metal dielectric. The exposed inter-metal layer is etched away to the underlying first metal layer. The remaining photoresist is removed. In-situ sputtering, performed to remove native metal oxide, also removes any of the remaining titanium oxide layer. This results in the desired pattern of openings in the inter-metal dielectric. A subsequent metal layer can be deposited, making contact with the first metal through the openings created in the inter-metal dielectric.

19 Claims, 6 Drawing Sheets

$TIO_x$ AS AN ANTI-REFLECTION COATING FOR METAL LITHOGRAPHY

BACKGROUND OF THE INVENTION

(1) Field of the Invention

The present invention relates to photolithographic techniques in semiconductor manufacturing and, more particularly, to anti-reflection coating for metal photolithography.

(2) Description of the Prior Art

In the construction of semiconductor integrated circuits, a photoresist layer covering the metal layer is selectively exposed to actinic light through a photomask resulting in the pattern on the photoresist layer. The exposed metal layer is etched away to the underlying dielectric layer.

The high reflectivity of the metal layer could scatter the light so that the photoresist under the masked areas would be exposed resulting in an incorrect patterning of the metal layer. It is a known practice in the prior art to use an anti-reflection layer between the metal and the photoresist layers. U.S. Pat. No. 4,820,611 to Arnold, III et al describes the use of a titanium nitride anti-reflection layer over titanium or aluminum. U.S. Pat. No. 5,066,615 to Brady et al describes the use of a metal-silicon-nitride anti-reflection layer where the metal in said layer is titanium, chromium, or the like.

SUMMARY OF THE INVENTION

A principal object of the present invention is to provide an effective anti-reflection coating.

Another object of the present invention is to provide an anti-reflection coating whose production is compatible with the process of the integrated circuit.

In accordance with the objects of this invention a new method of producing an anti-reflection coating is achieved. The reflective metal layer of an integrated circuit is covered with titanium. The titanium layer is oxidized. The resulting titanium oxide layer is the anti-reflection coating (ARC) of the present invention. This ARC layer is covered with photoresist. The photoresist layer is selectively exposed to light by directing light through a patterned mask to form a pattern on the photoresist layer. The metal layer is etched in accordance with the pattern. The remaining resist is stripped off. An inter-metal dielectric layer is deposited over the patterned first metal and titanium oxide layers. A second photoresist layer is deposited and selectively exposed to light through a second photomask. The titanium oxide layer again acts to limit the reflection of light off the first metal layer and through the transparent inter-metal dielectric. The exposed inter-metal layer is etched away to the underlying first metal layer. The remaining photoresist is removed. In-situ sputtering, performed to remove native metal oxide, also removes any of the remaining titanium oxide layer. This results in the desired pattern of openings in the inter-metal dielectric. A subsequent metal layer can be deposited, making contact with the first metal through the openings created in the inter-metal dielectric.

BRIEF DESCRIPTION OF THE DRAWINGS

In the accompanying drawings forming a material part of this description, there is shown.

DESCRIPTION OF THE PREFERRED EMBODIMENTS

Figure 1:
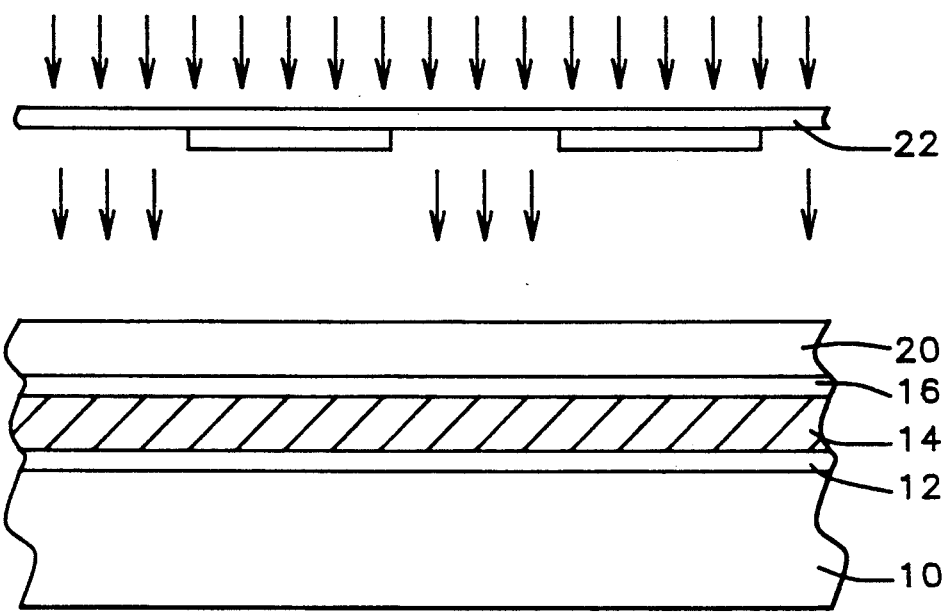
FIGS. 1 through 6 schematically illustrate in cross-sectional representation one preferred embodiment of this invention.

Referring now more particularly to FIG. 1, there is shown an illustration of a partially completed integrated circuit. A dielectric layer 12 composed of silicon dioxide has been deposited by Chemical Vapor Deposition (CVD) on semiconductor substrate 10, preferably composed of silicon. A layer 14 of aluminum or aluminum alloy, such as aluminum-silicon-copper, is sputter deposited to a thickness of between 2000 to 20,000 Angstroms. Next, the anti-reflection coating of the present invention is produced. Titanium is sputter deposited to a thickness of between about 200 and 1000 Angstroms, but preferably between 300 to 500 Angstroms. Less than about 200 Angstroms could find some parts of the layer not thick enough, so that oxidation could extend completely through parts of the layer and not other parts of the layer. Where the thickness is too thick, the conductivity of the metal layer 14, 16 would be effectively reduced. The titanium layer should be kept as thin as possible so that the step height of this portion of the structure is not unduly increased and/or the aluminum layer decreased as this would have a conductivity adverse effect. This layer is indicated by 16 in FIG. 1.

The color of heavily oxidized titanium film (such as $TiO_2$) is dark blue or brownish, but partially oxidized Titanium retains its metallic color. $TiO_2$ is a good anti-reflection coating, but it is a bad conductor and it does not alloy well with the underlying metal layer 14. Titanium can absorb about 30 atomic percentage of oxygen without undergoing a conductive property change. A uniform, controlled oxidation of titanium to $TiO_x$ is required.

Figure 7:
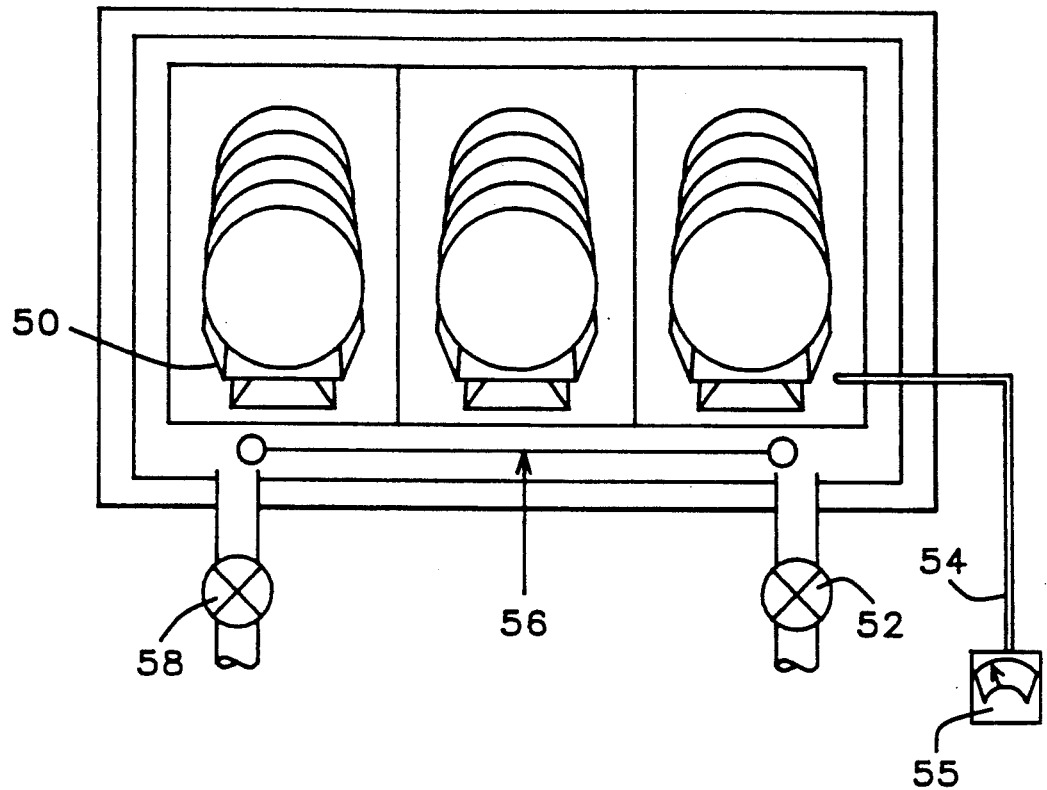
FIG. 7 schematically illustrates one apparatus which can be used to form the titanium oxide anti-reflection coating of the present invention.

The oxidation process takes place within a vacuum chamber such as the Tegol Mega 6, which is normally used for photoresist stripping, illustrated in FIG. 7. The wafers to be treated reside in wafer boats 50 within the vacuum chamber. A vacuum pump 52 is used to maintain a vacuum pressure of between about 250 to 1000 mTorr. A thermocouple 54 attached to a temperature meter 55 maintains the temperature at less than or equal to 300° C., preferably 150° C. A radio frequency source 56 of 1300 watts is applied resulting in the formation of a corona around the wafers in the chamber. A Mass Flow Controller 58 controls the flow of oxygen plasma into the vacuum chamber. The preferred oxidation time is between 5 and 60 minutes.

Referring again to FIG. 1, layer 16 may be a combination of Titanium and Titanium oxide or it may be entirely Titanium oxide, depending on the oxidation time. Separate layers are not shown to depict titanium and titanium oxide, because of the above described situation.

Figure 2:
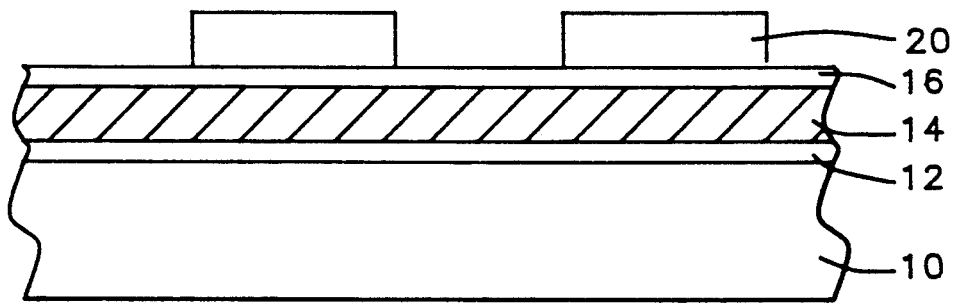

A photoresist layer 20 is deposited on top of the titanium oxide. Light is passed through a photomask 22 to expose the resist. The resist layer is then developed to form photoresist layer 20. FIG. 2 shows photoresist layer 20 after its development.

Figure 3:
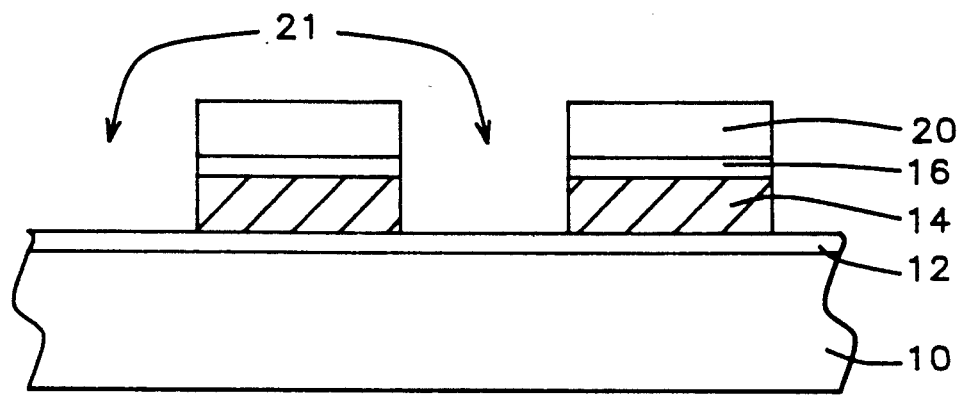

Referring now to FIG. 3, there are shown openings 21 resulting from conventionally etching through the photoresist layer 20, the titanium oxide layer 16 and the metal layer 14.

Figure 4:
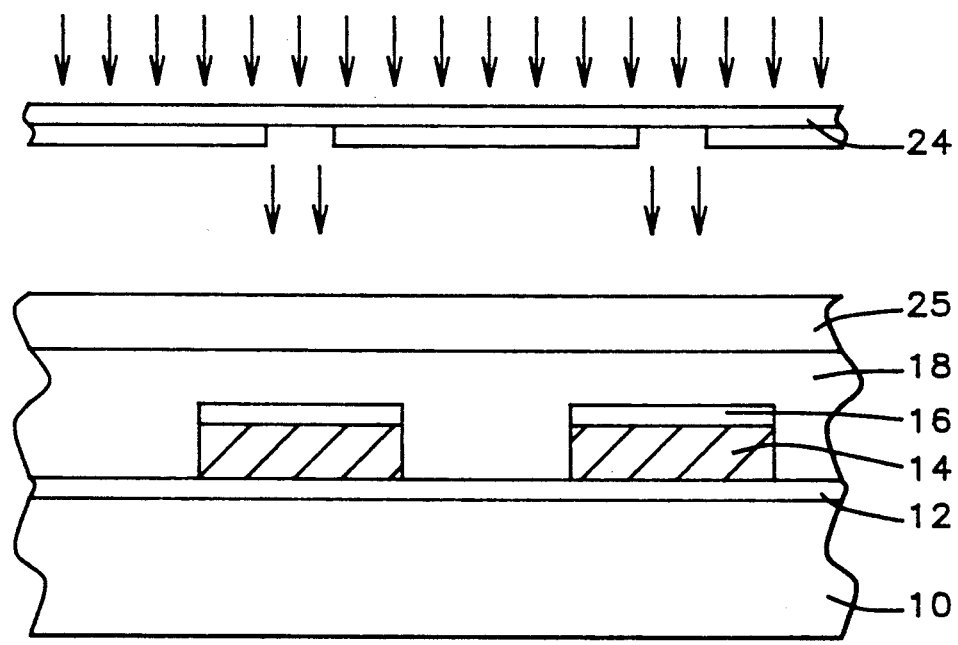

Referring now to FIG. 4, an inter-metal insulating layer 18, composed of silicon dioxide is deposited by conventional techniques such as silane or TEOS to a thickness of between 2000 to 10,000 Angstroms. A second photoresist layer 25 is deposited over the inter-metal dielectric. Note that the titanium oxide layer 16 remains as an anti-reflection coating on the metal layer 14. This titanium oxide will also serve to decrease hillock growth on the underlying aluminum layer.

Figure 5:
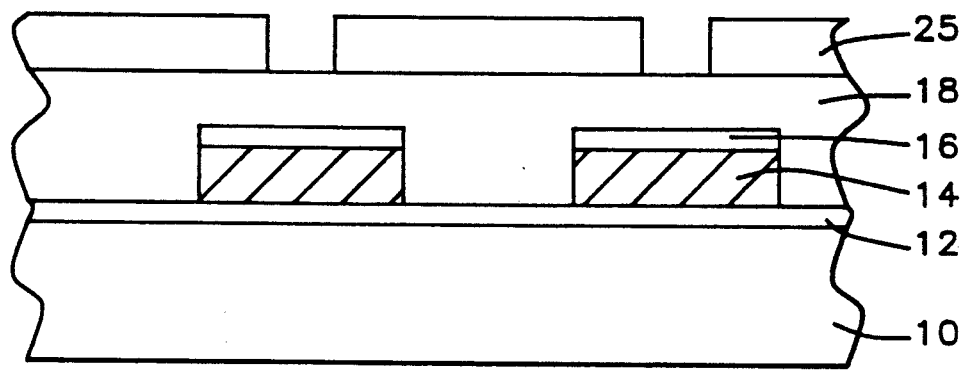

Light is passed through a second photomask 26 to expose the resist. The resist layer is developed to form the photoresist layer 25 illustrated in FIG. 5.

The $CHF_3$-$O_2$ etching system is preferably used to etch through the silicon oxide dielectric layer 18 and the titanium oxide portion of layer 16 to contact the any titanium portion of layer 16 (if any) and first metal layer 14. The recipe for this etch process is given in Table A below.

TABLE A

| $O_2$ (sccm) | $CHF_3$ (sccm) | Pressure (mTorr) | DC Bias (V) | Power W | Time (min) | Thickness (Angstroms) |
|---|---|---|---|---|---|---|
| 8 | 85 | 50 | 540 | 1400 | 6 | 3500 |

Figure 6:
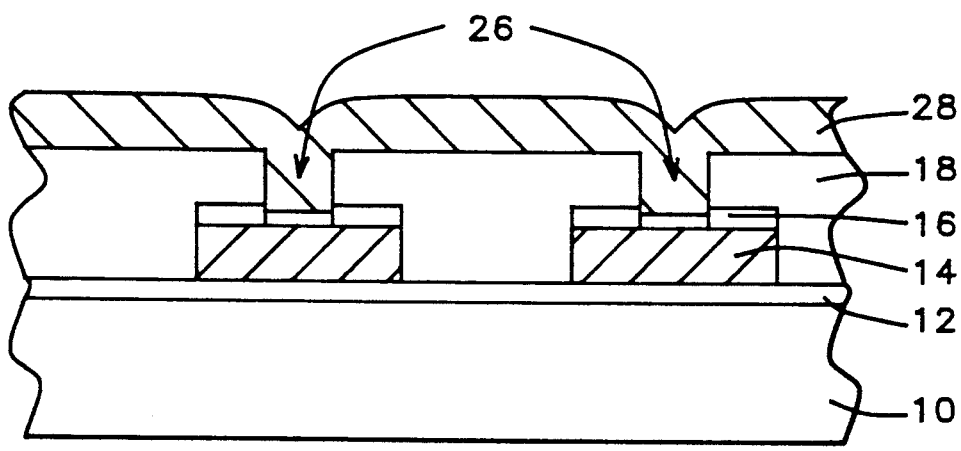

When using the etch process described above, there is no etch stop effect; that is, the etching proceeds at about the same rate through both the silicon dioxide and titanium oxide layers. FIG. 6 illustrates openings 26 resulting from the etching process. Note that while the titanium oxide is etched away with the silicon dioxide layer 18, any unoxidized titanium in layer 16 remains. In-situ sputtering, required to clean up the native metal oxide for all metal-to-metal contacts, also acts to remove all remaining titanium from the openings 26. Outside the openings the very thin titanium remains as a minor portion of the first metal layer.

A second metal layer 28 is deposited which contacts the first metal 14 through the patterned openings. Processing continues from this point as is conventional to fabricate the desired integrated circuit.

Figure 8:
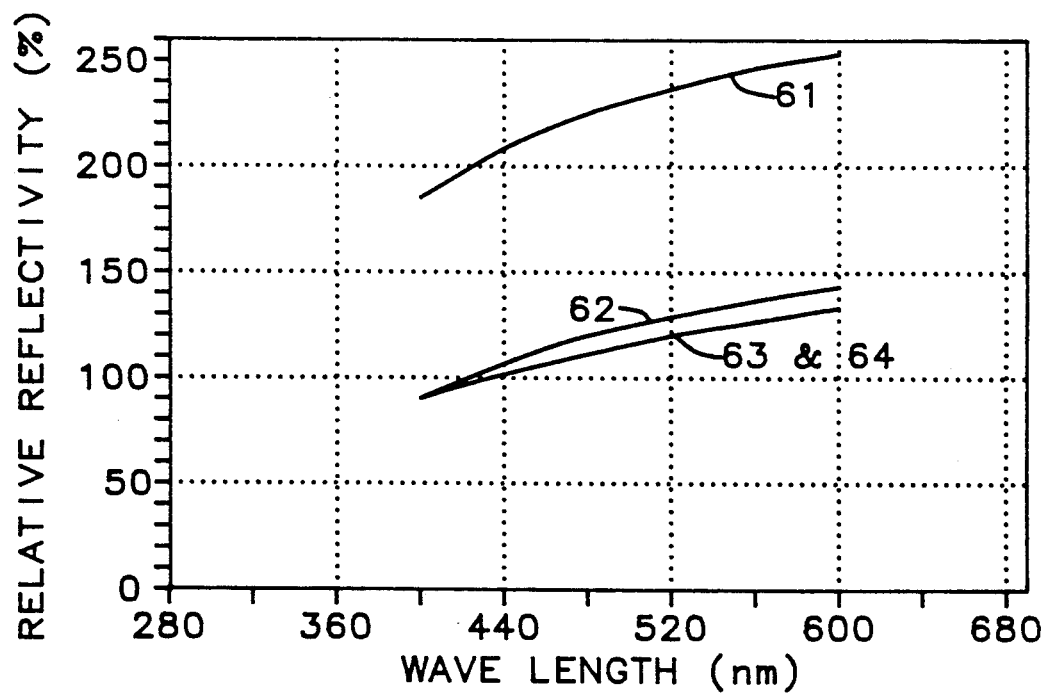
FIGS. 8 and 9 graphically illustrate the reflectivity of the anti-reflection coating before and after oxidation, respectively.
Figure 9:
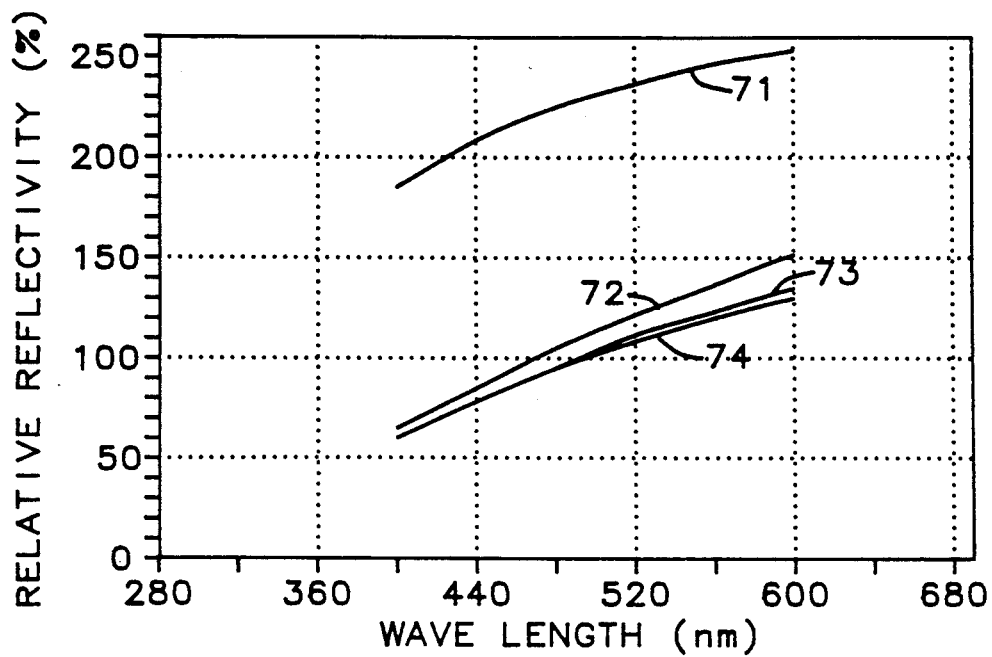

Referring now to FIGS. 8 and 9, we can see the effectiveness of the anti-reflection coating of the present invention. Both graphs show the reflectivity of the ARC relative to the reflectivity of bare silicon at 100%. Titanium was deposited on an alloy of aluminum-silicon-copper (thickness of 4500 Angstroms). FIG. 8 shows the relative reflectivity at different wavelengths of the bare substrate (line 61), 200 Angstroms of titanium (line 62), 300 Angstroms of titanium (line 63) and 500 Angstroms of titanium. FIG. 9 shows the relative reflectivity at different wavelengths after the test wafers have been oxidized for 60 minutes according to the process of the present invention. Line 71 represents the bare substrate; line 72, 200 Angstroms of titanium oxide; line 73, 300 Angstroms of titanium oxide; and line 74, 500 Angstroms of titanium oxide. It can be seen from these graphs that the titanium anti-reflection coating significantly reduces reflectivity and that the oxidation treatment further reduces reflectivity. Furthermore, it can be seen that lines 73 and 74 are coextensive indicating that the process window is from 300 to 500 Angstroms for the ARC thickness.

Figure 10:
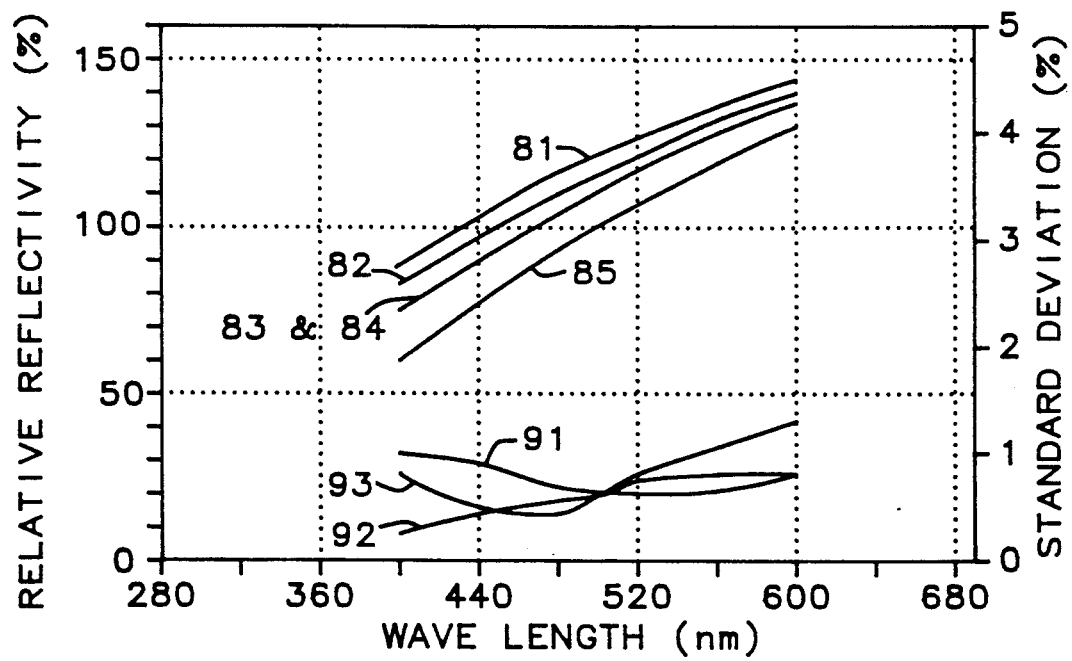
FIG. 10 graphically illustrates the reflectivity change of 500 Angstrom titanium anti-reflection coating with differing oxidation times.

Referring now to FIG. 10, there is shown the relative reflectivity at different wavelengths of a 500 Angstrom thickness of titanium. As in the previous graphs, the reflectivity of bare silicon is 100%. This graph shows the change in relative reflectivity with increasing plasma treatment times. Line 81 represents the initial untreated titanium. Line 82 represents the ARC after one minute of oxygen plasma treatment. Line 83 represents the ARC after 5 minutes of oxidation. Line 84, almost coextensive with line 83, represents the ARC after 20 minutes of oxidation. Finally, line 85 represents the ARC after 60 minutes of plasma treatment. This graph illustrates that the longer the plasma treatment, the lower the reflectivity and the shorter the wavelength, the lower the reflectivity.

Referring now to the lines at the bottom of FIG. 10, there is illustrated the uniformity within a wafer of the titanium oxide reflectivity. Five points were measured on a wafer for each test and the standard deviation calculated. Line 91 represents the standard deviation of the initial titanium layer before oxidation. Line 92 represents the standard deviation after 20 minutes of oxygen plasma treatment. Line 93 represents the standard deviation after 60 minutes of oxidation. It can be seen that the standard deviation in all cases illustrated is less than 1.5% indicating an effective process.

Figure 11:
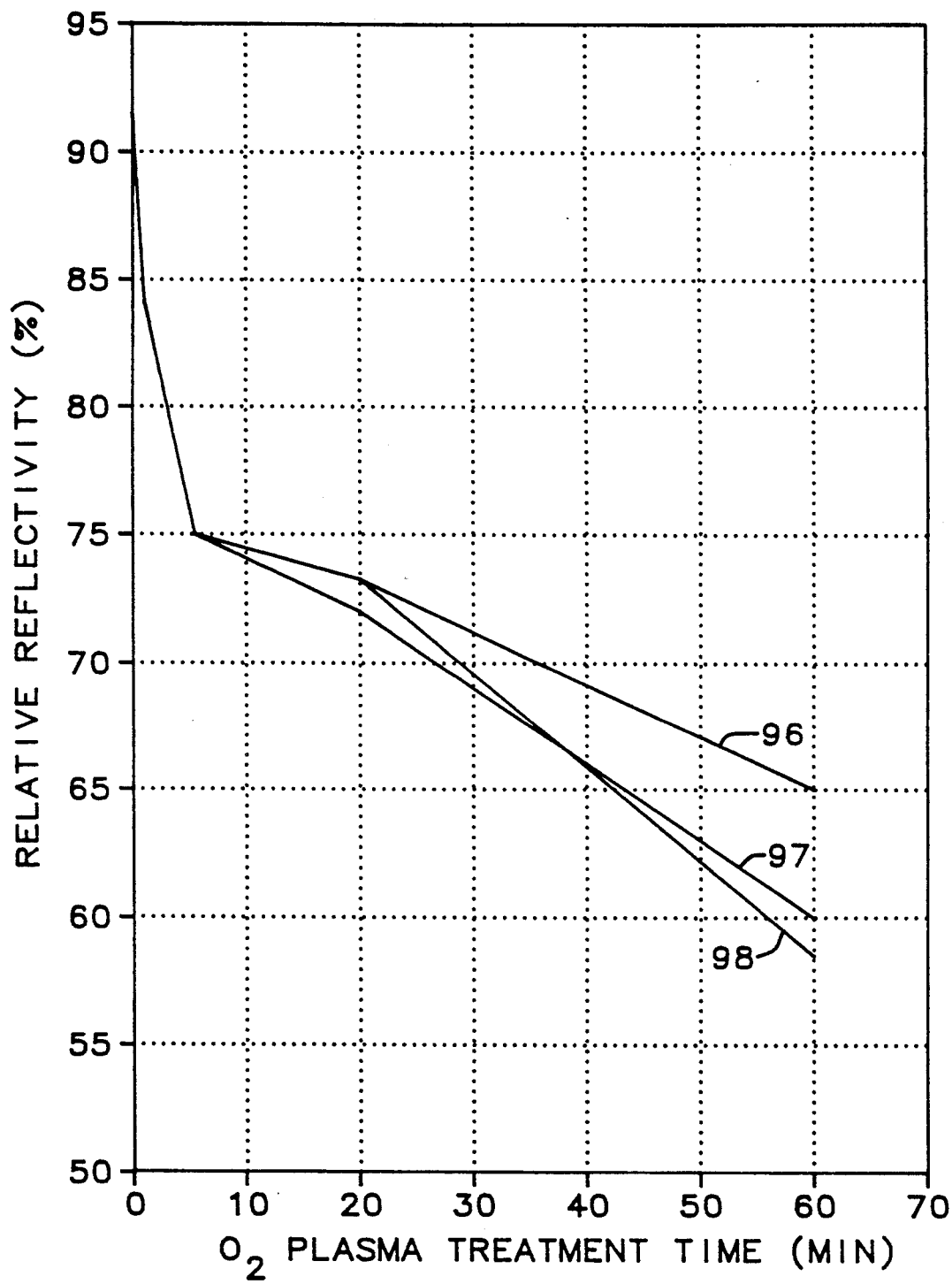
FIG. 11 graphically illustrates the reflectivity change of different thicknesses of the anti-reflection coating.

Referring now to FIG. 11, there is shown the relative reflectivity change of different thicknesses of titanium after increasing oxidation times. Line 96 represents a titanium thickness of 200 Angstroms, line 97 represents a thickness of 300 Angstroms, and line 98 represents a thickness of 500 Angstroms. It can be seen that there is a dramatic reduction in relative reflectivity after $O_2$ plasma treatment-from near 90% to 82% at 1 minute and to 75% at 5 minutes.

The operative $O_2$ plasma treatment time is 1 second to 99 minutes, 59 seconds (an equipment limitation). The preferred oxidation time is about 60 minutes resulting in a relative reflectivity of about 60%. The oxidation occurs in an oxygen plasma under the following preferred conditions (1) time between about 5 and 60 minutes, (2) at a vacuum of between about 250 to 1000 mTorr and (3) at a radio frequency power of 1300 watts. This process produces an oxidation of the titanium layer to less than about an absorption of 30% atomic percentage of oxygen to a uniform anti-reflective titanium oxide layer.

The following Examples are given in an effort to point out the important problems solved by features of the invention over that of the prior art and are not intended to limit the invention in any way.

EXAMPLES

Table 1 illustrates the resistivity (in ohms/square of area) of the titanium oxide anti-reflection film of three thicknesses after increasing $O_2$ plasma treatment times (in minutes).

TABLE 1

| Ti thickness | time | Rs | time | Rs | time | Rs | time | Rs |
|---|---|---|---|---|---|---|---|---|
| 200 A | 0 | 50.02 | 5 | 55.48 | 20 | 56.21 | 60 | 81.32 |
| 300 A | 0 | 28.84 | 5 | 30.11 | 20 | 30.20 | 60 | 36.45 |
| 500 A | 0 | 15.9 | 5 | 15.99 | 20 | 15.96 | 60 | 16.07 |

It can be seen from Table 1 that there is a substantial increase in resistivity for the 200 A sample. This indicates that much more of the titanium in the 200 A sample has turned into titanium oxide than in the thicker samples. The lower resistivity of the 300 and 500 A samples is preferred.

Table 2 illustrates O₂ plasma conditions at < =150° C.

TABLE 2

| O₂ flow rate | Pressure | RF power | Reflectivity | Resistance |
|---|---|---|---|---|
| initial | | | 96.24% | 30.23 ohms/sq |
| 100 s.c.c.m. | 260 mTorr | 1300 | 88.08% | — |
| 200 s.c.c.m. | 446 mTorr | 1300 | 88.05% | 31.57 ohms/sq |
| 500 s.c.c.m. | 950 mTorr | 1300 | 89.02% | 31.36 ohms/sq |

From the data in Table 2, it can be seen that the flow rate of oxygen and the pressure do not effect the oxidation rate of the titanium film. The operative ranges are a pressure of between 260 to 950 mTorr and a flow rate of between 100 to 500 s.c.c.m.

While the invention has been particularly shown and described with reference to the preferred embodiments thereof, it will be understood by those skilled in the art that various changes in form and details may be made without departing from the spirit and scope of the invention.

What is claimed is:

1. A photolithographic method of patterning a reflective metal layer of a semiconductor circuit comprising:
   covering said reflective metal layer of an integrated circuit with a titanium layer having a thickness of between about 200 to 1000 Angstroms;
   oxidizing said titanium layer to less than about an absorption of 30 atomic percentage oxygen to form a uniform anti-reflective, conductive titanium oxide layer;
   covering said titanium oxide layer with a resist layer;
   selectively exposing said resist layer to light by directing light through a patterned mask to expose a pattern in said resist layer;
   developing said resist layer to form an etching mask;
   etching openings in said titanium oxide metal layers using said etching mask; and
   removing said etching mask to complete said patterning of said metal layer.

2. The method of claim 1 wherein said metal layer is composed of aluminum.

3. The method of claim 1 wherein said titanium layer is formed by sputtering.

4. The method of claim 1 wherein the preferred thickness of said titanium layer is between about 200 and 1000 Angstroms.

5. The method of claim 1 wherein said oxidation of said titanium layer takes place within a vacuum chamber and the vacuum is less than about one Torr and only partially oxidizes said titanium layer.

6. The method of claim 1 wherein said oxidation continues until titanium is partially oxidized in an oxygen plasma to the point that the titanium oxide is still conductive and the time of said oxidation is between about 5 and 60 minutes.

7. A method for making an integrated circuit comprising:
   forming a dielectric layer over a semiconductor substrate;
   forming over said dielectric layer a first metal layer which has a high reflectivity;
   covering said first metal layer with a layer of titanium having a thickness of between about 200 to 1000 Angstroms;
   partially oxidizing said titanium layer to less than about an absorption of 30 atomic percentage of oxygen which is an oxidation state that allows the titanium oxide formed by the oxidation to remain conductive;
   covering said titanium oxide layer with a first resist layer;
   selectively exposing said first resist layer to light by directing light through a patterned mask to expose a pattern in said first resist layer and developing said pattern in said first resist layer;
   etching openings in said titanium oxide first metal layers using said pattern in said first resist layer as an etching mask;
   removing said first resist layer etching mask;
   covering said patterned first metal and titanium oxide layers with an inter-metal insulating layer;
   covering said inter-metal insulating layer with a second resist layer;
   selectively exposing said second resist layer to light by directing light through a patterned mask to expose a pattern in said second resist layer and developing the resist to form an etching mask therein;
   etching openings in said inter-metal insulating layer using said etching mask;
   removing said etching mask; and
   depositing a second metal layer contacting said first metal layer through said patterned openings resulting in the desired integrated circuit.

8. The method of claim 7 wherein said metal layer is composed of aluminum.

9. The method of claim 7 wherein said titanium layer is formed by sputtering.

10. The method of claim 7 wherein the preferred thickness of said titanium layer is between about 200 and 1000 Angstroms.

11. The method of claim 7 wherein said oxidation of said titanium layer takes place within a vacuum chamber and the vacuum is less than about one Torr.

12. The method of claim 7 wherein said oxidation occurs in an oxygen plasma under the conditions of time between about 5 and 60 minutes, at a vacuum of between about 250 to 1000 mTorr and at a radio frequency power of 1300 watts.

13. The method of claim 7 wherein said inter-metal insulating layer is composed of silicon dioxide.

14. The method of claim 13 wherein said silicon dioxide layer is etched by a $CHF_3 + O_2$ etching system so that said silicon dioxide and titanium oxide are etched at a similar rate with this etching system.

15. The method for reducing the light reflection from a reflective metal surface into a resist layer formed thereover comprising:
   covering said reflective metal surface with a titanium layer having a thickness of between about 200 to 1000 Angstroms;
   oxidizing said titanium layer to less than about an absorption of 30 atomic percentage of oxygen to form a uniform anti-reflective, conductive titanium oxide layer;
   covering said titanium oxide layer with a resist layer;
   selectively exposing said resist layer to light by directing light through a patterned mask to expose said resist layer;

developing said resist layer to form an etching mask;

etching openings in said metal layer using said etching mask; and removing said etching mask.

16. The method of claim 15 wherein said titanium layer is formed by sputtering, the thickness of said titanium layer is between about 200 and 1000 Angstroms.

17. The method of claim 15 wherein said oxidation of said titanium layer takes place within a vacuum chamber and the vacuum is less than about one Torr.

18. The method of claim 15 wherein said oxidation occurring in an oxygen plasma under the conditions of time between about 5 and 60 minutes, at a vacuum of between about 250 to 1000 mTorr and at a radio frequency power of 1300 watts.

19. The method of claim 15 wherein said metal layer is composed of aluminum.

* * * * *